United States Patent
Czaplewski et al.

(10) Patent No.: US 11,872,729 B2
(45) Date of Patent: Jan. 16, 2024

(54) FEATURE CASTING FOR MANUFACTURE OBSERVATION

(71) Applicant: International Business Machines Corporation, Armonk, NY (US)

(72) Inventors: Sarah K. Czaplewski, Rochester, MN (US); Joseph F. Doman, Raleigh, NC (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 17/175,974

(22) Filed: Feb. 15, 2021

(65) Prior Publication Data

US 2021/0178640 A1 Jun. 17, 2021

Related U.S. Application Data

(63) Continuation of application No. 15/465,073, filed on Mar. 21, 2017, now Pat. No. 10,974,420.

(51) Int. Cl.
| | |
|---|---|
| *B29D 11/00* | (2006.01) |
| *B29C 41/02* | (2006.01) |
| *B29C 41/00* | (2006.01) |
| *B29C 41/46* | (2006.01) |
| *B29C 41/42* | (2006.01) |
| *B29C 41/50* | (2006.01) |
| *H05K 3/42* | (2006.01) |
| *B29K 83/00* | (2006.01) |
| *B29K 75/00* | (2006.01) |
| *B29L 31/00* | (2006.01) |

(52) U.S. Cl.
CPC ............ *B29C 41/02* (2013.01); *B29C 41/003* (2013.01); *B29C 41/42* (2013.01); *B29C 41/46* (2013.01); *B29C 41/50* (2013.01); *H05K 3/429* (2013.01); *B29K 2075/00* (2013.01); *B29K 2083/00* (2013.01); *B29L 2031/757* (2013.01); *H05K 2203/16* (2013.01)

(58) Field of Classification Search
CPC ..... B29C 33/3842; B29C 39/10; B29C 41/02; B29C 41/003; G01N 27/44721; H05K 3/429
See application file for complete search history.

(56) References Cited

U.S. PATENT DOCUMENTS

| | | | |
|---|---|---|---|
| 5,004,339 A | 4/1991 | Pryor | |
| 5,595,704 A | 1/1997 | Hayashi | |
| 6,598,994 B1 | 7/2003 | Tait | |
| 7,394,530 B2 | 7/2008 | Budd | |
| 10,974,420 B2 * | 4/2021 | Czaplewski | ............ B29C 41/46 |
| 2003/0006527 A1 | 1/2003 | Rabolt | |
| 2003/0214057 A1 * | 11/2003 | Huang | .............. B01L 3/502707 |
| | | | 425/808 |
| 2005/0275139 A1 | 12/2005 | Bencze | |
| 2014/0065035 A1 | 3/2014 | Son | |
| 2017/0330316 A1 | 11/2017 | Czaplewski | |

OTHER PUBLICATIONS

Czaplewski et al A New Method for Non-Destructive Characterization of Through Holes in Printed Circuit Boards, IMAPS 2018—51st International Symposium on Microelectronics—Pasadena, CA USA—Oct. 8-11, 2018.*
Chen et al (Automatic optical inspection system for IC molding surface, J Intell. Manuf (2016) 27:915-926, Published online: Jun. 3, 2014).*
IPC, "IPC-TM-650 Test Methods Manual," May 2014, Downloaded from the Internet Dec. 19, 2016, 10 pages, https://www.ipc.org/TM/2-6_2-6-26A.pdf.
Jo et al Three-Dimensional Micro-Channel Fabrication in Polydimethylsiloxane (PDMS) Elastomer, (Journal of Microelectromechanical Systems, vol. 9, No. 1, Mar. 2000.
List of IBM Patents or Patent Applications Treated as Related.
P. Reid, "Reid on Reliability: Foiling Foil Cracks," Nov. 10, 2010, Downloaded from the Internet Dec. 19, 2016.
P. Singh et al., "Failure modes and mechanisms in electronic packages," Springer Science & Business Media, 2012, p. 60.
WB Interconnect Solutions Inc., "IST testing systems and services." Downloaded from the Internet, Dec 19, 2016, http://www.pwbcorp.com/EN/index.php.
Schmidt "No More Cooling Required"(https://www.moldmakingtechnology.com/articles/no-more-cooling-required, published on Feb. 1, 2015).

* cited by examiner

*Primary Examiner* — Gregory Listvoyb
(74) *Attorney, Agent, or Firm* — Nathan M. Rau

(57) ABSTRACT

Circuit feature casting for manufacture observation is disclosed herein. According to an aspect, a method includes applying a molding material to a feature of a circuit to substantially cover the feature with the molding material. The method also includes curing the molding material. Further, the method includes separating the molding material from the feature to reveal a cast of the feature of the circuit.

10 Claims, 8 Drawing Sheets

FEATURE CASTING FOR MANUFACTURE OBSERVATION

TECHNICAL FIELD

The present invention is related to circuits, and more specifically, to a feature casting for manufacture observation.

BACKGROUND

Through-hole technology is a commonly used mounting technique used for electronic components that involves the use of leads on the components that are inserted into holes formed in printed circuit boards (PCBs) and soldered to pads on the opposite side. Through-holes can be either plated or non-plated. A difference between non-plated through-hole and plated through-hole (PTH) is the presence of plated copper inside the hole barrel. PTHs provide a conductive path between circuits on the multi-layer board (MLB) and devices and connectors attached to the MLB by solder or mechanical pressfit insertion. The reliability and performance of this electrical path can be impacted by the quality (thickness and roughness) of the PTH.

Failure of a PTH constitutes an electrical discontinuity that can be caused by circumferential barrel cracks, land corner cracks, separation of lands from a multi-layer board surface, and/or shearing of internal traces. Such failures can result from the thermomechanical stresses caused by the large differences in the coefficients of thermal expansion (CTE) between the PTH plating materials and the MLB in the thickness direction of the MLB. Some failure mechanisms include ductile fracture of the plating caused by thermal shock during soldering, fatigue fracture of the plating caused by cyclic temperature variations (operational and environmental loads), and interfacial de-adhesion between the plating and the surrounding MLB caused by low temperatures.

For PCB manufacturers, it can be useful to observe through holes prior to plating. It can also be useful to observe various other results of manufacture. A PCB may be flat or cross sectioned such that the through hole can be viewed for defects. As a result, the PCB is significantly damaged and thus cutting is undesirable. For at least this reason, improved techniques are needed for observing through holes and other circuit features.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to an aspect, a method includes preparing a molding material comprising a pre-polymer base component and one of a hardener and curing agent component. The method also includes applying the molding material inside a plated through-hole of a circuit to substantially cover sides of the plated through-hole with the molding material. Further, the method includes curing the molding material. The method also includes separating the molding material from the plated through-hole to reveal a cast of the plated through-hole.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings.

DETAILED DESCRIPTION

Figure 1A:
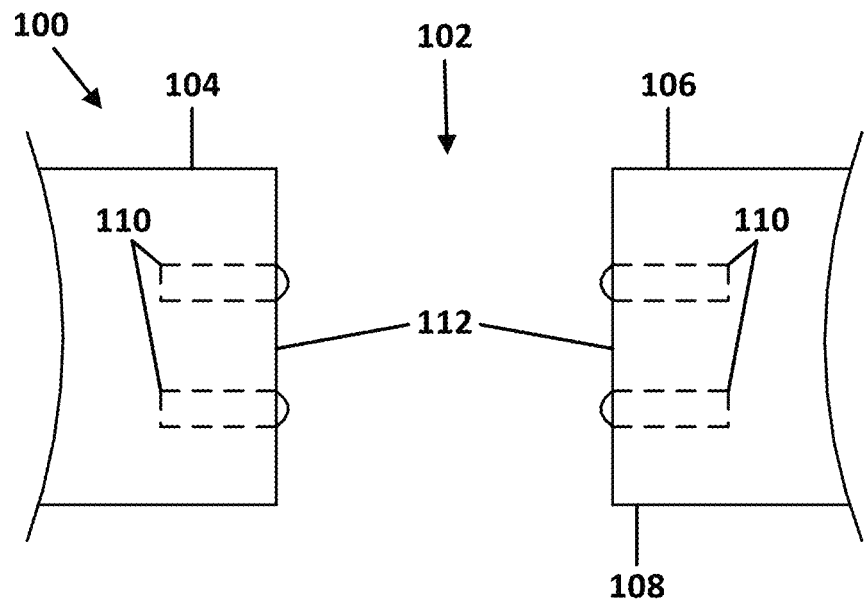
FIG. 1A is a cross-sectional side view of a portion of an example circuit that defines a PTH for observation and analysis in accordance with embodiments of the present invention.

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described.

The present invention relates to methods for casting features of circuits. For example, methods disclosed herein may be used for producing a cast of circuit through-holes or other features of interest. In accordance with embodiments, a molding material may be applied to a through-hole or other feature of a circuit to cover the feature with the molding material. The molding material may subsequently be cured and separated from the feature to reveal a cast of the feature. The cast may replicate, for example, a circuit's through-hole topography, thereby providing a visual representation of through-hole quality without subjecting the circuit to cross sectioning. The cast may a qualitative process indicator by allowing a person to inspect the cast plating roughness, plating nodules, and backdrill integrity. A scanning or laser microscope may be used for inspection of the cast.

It is noted that although the invention is primarily described herein as casting through-holes, it may also be applicable to a wide variety of circuit components having small features, particularly small internal spaces, requiring inspection. In this way, an observer may view circuit feature characteristics on the cast such as, but not limited to, dimensions and shape.

As referred to herein, the term "molding material" is a substance suitable for making a cast of a structure or feature. The molding material has a viscosity sufficient for forming around the structure or feature from which a cast is desired. Once formed around the structure or feature, the molding material may be suitably cured to form the cast. Example molding materials may include a two-part elastomer formed from a mixture of a base component and a hardener component. An example elastomer is a silicone elastomer. Two example elastomeric casting compounds are silicones and polyurethanes. Silicones can be cured, for example, by one of: Pt-catalyzed addition curing; condensation curing utilizing a dialkoxy siloxane and a tin catalyst; and peroxide curing using a free radical initiator. Urethane elastomers are the reaction product of a diisocyanate and any compound containing a reactive hydrogen, such as alcohols, amines, and water.

As referred to herein, the term "curing" refers to a process of chemical reaction or physical action that results in a harder, tougher, or more stable linkage, such as an adhesive bond, or substance. For example, curing may be applied to a suitable molding material. Some curing processes are conducted within a prescribed temperature range and/or humidity level, and others may require a particular pressure.

The present invention is now described in more detail. For example, FIG. 1A illustrates a cross-sectional side view of a portion of an example circuit 100 that defines a PTH 102 for observation and analysis in accordance with embodiments of the present invention. Referring to FIG. 1A, the circuit 100 includes a circuit board 104. The PTH 102 defines a pathway that extends between a top side 106 of the circuit board 104 and a bottom side 108 of the circuit board 104. The circuit board 104 can include various traces 110 that protrude from sides 112 of the PTH 102. It should be understood that this PTH 102 provides one example shape and dimension of the surface of the PTH 102. Other circuit features to which the present invention may be applied may have other shapes and dimensions.

Figure 1B:
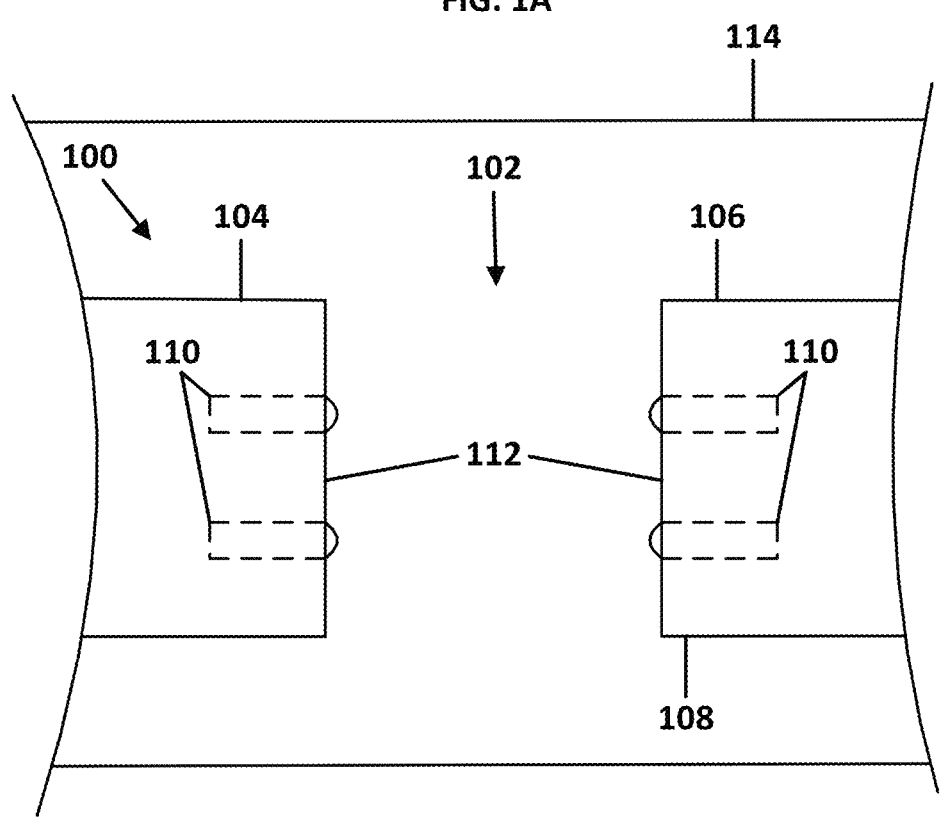
FIG. 1B depicts an example initial step for casting the PTH shown in FIG. 1A in accordance with embodiments of the present invention.

FIG. 1B illustrates an example initial step for casting the PTH 102 shown in FIG. 1A in accordance with embodiments of the present invention. Particularly, this figure illustrates a cross-sectional side view of a portion of the circuit 100 with a molding material 114 applied thereto in accordance with embodiments of the present invention. Referring to FIG. 1B, the molding material 114 is applied to the PTH 102 to cover the sides 112 of the PTH 102. The molding material 114 may entirely or at least substantially cover the sides 112. More particularly, the molding material 114 may have a viscosity sufficient for contacting all or nearly all features of the topography of the sides 112. This can be important for forming an accurate cast of the topography of the sides of the PTH 102. In an example, the molding material 114 is SYLGARD® 184 silicone elastomer kit (available from The Dow Chemical Company of Auburn, Michigan) which includes a pre-polymer base component and a curing agent or hardener component mixed in about a 10:1 ratio. It should be noted that any suitable molding material 114 may be used.

In an example of applying the molding material to a circuit feature, the circuit 100 may be placed in a container, such as a mounting cup, that is holding the molding material 114. In this way, the PTH 102 may be submerged entirely or at least partially in the molding material 114. In an example, the circuit 100 may be placed in the container and subsequently the molding material 114 may be poured into the container or onto the circuit 100 for application of the molding material 114. Any other suitable techniques may be used for applying molding material to the circuit 100.

In another example of applying the molding material to a circuit feature, a vacuum chamber may be utilized for enabling the molding material to cover a circuit feature. For example, the aforementioned container holding the circuit 100 and molding material 114 may be placed in a vacuum chamber. Subsequently, a vacuum pump, suitably configured with the vacuum chamber, may be activated to thereby draw air (or other gases) from the vacuum chamber. The drawing of air by the vacuum pump can pull the molding material 114 into the PTH 102 or another such internal space of the circuit 100 to thereby cover small internal surfaces. It should be understood that any other suitable pneumatic technique may be used for enabling the molding material to cover circuit features.

Subsequent to applying the molding material 114 to the PTH 102 and/or other circuit feature, the molding material 114 may be cured. In this way, the molding material 114 may harden sufficiently such that it may be removed or otherwise separated from the PTH 102. In an example, the molding material 114 may be cured by baking at about 100 degrees Celsius for about an hour. Alternatively, the molding material 114 may be otherwise suitably heated for curing the molding material 114. It should be understood that the molding material may be cured by any suitable technique.

Figure 1C:
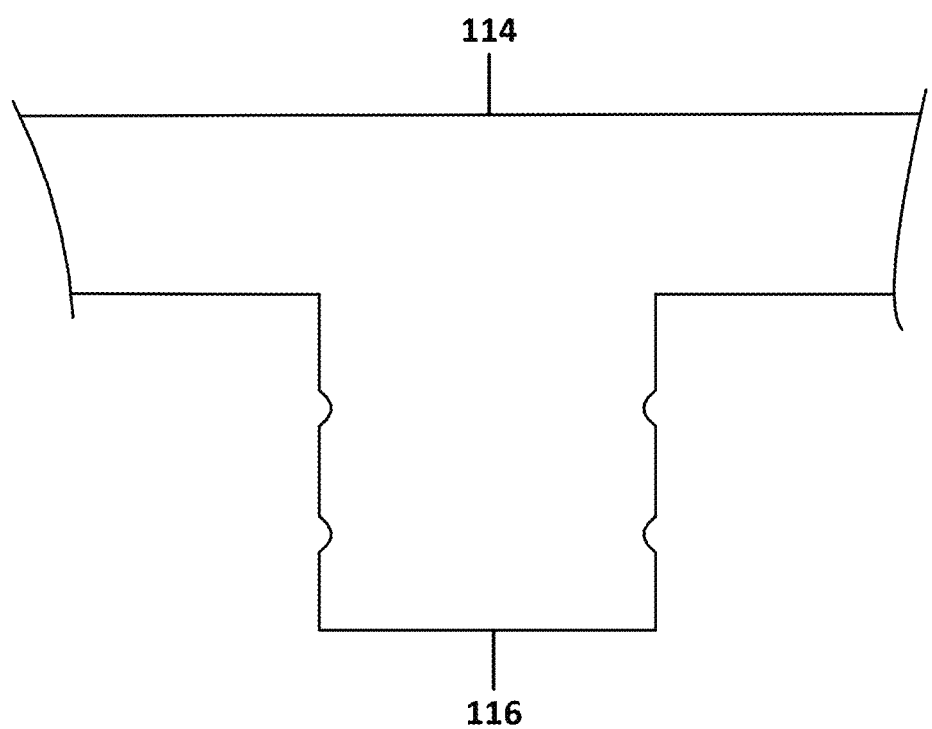
FIG. 1C depicts the molding material after separation from the PTH in accordance with embodiments of the present invention.

Now referring to FIG. 1C, the figure illustrates the molding material 114 after separation from the PTH 102 in accordance with embodiments of the present invention. Referring to FIG. 1C, a lower portion 116 may be cut in order for at least some of the molding material 114 to be separated from the PTH 102 (not shown in FIG. 1C). The molding material 114 may be gently removed from the PTH 102 by hand in order to avoid breaking the molding material 114. The removed molding material 114 is a cast of the PTH 102 and can provide an accurate representation of the shape of the sides of the PTH. In this way, an inspector can view defects, if any, in the PTH sidewall. Example features of interest to an inspector include, but are not limited to nodules in plating, cracks, and differences in plating.

It is noted that the present invention may be applied for producing casts of a variety of circuit features. For example, the present invention may be used for producing a cast of a blind via or the like. This method may also be used to characterize backdrill quality. For example, the depth of backdrill and concentricity with the PTH barrel could be measured.

Figure 2:
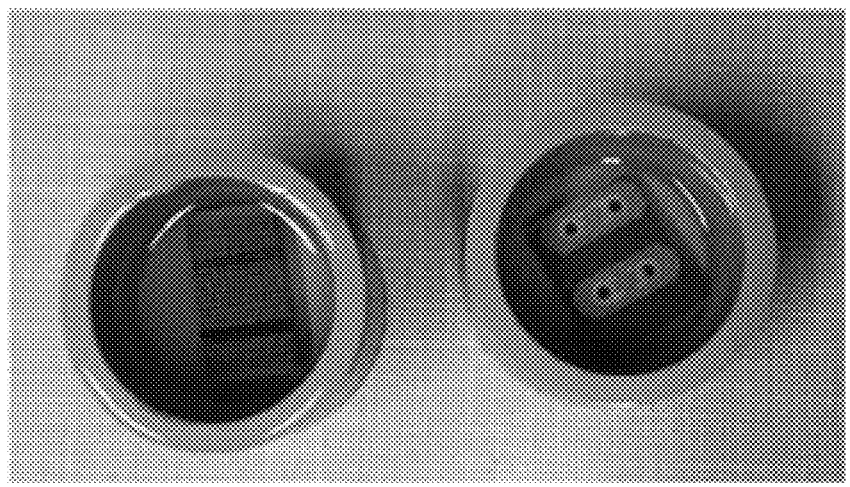
FIG. 2 is an image showing mounting cups that are each holding a coupon section submerged in molding material.
Figure 3A:
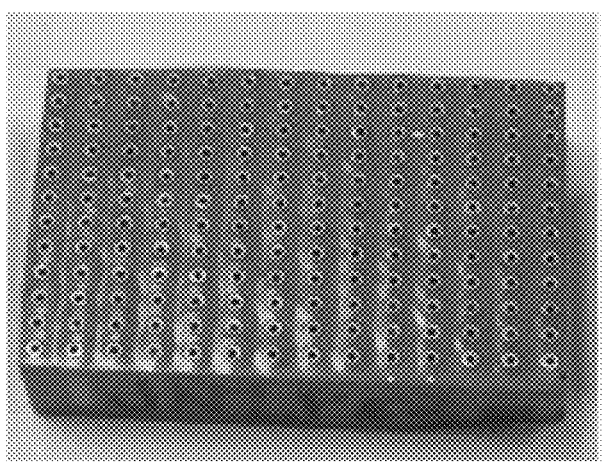
FIG. 3A is an image showing an example PCB with vias that was submerged in molding material in accordance with embodiments of the present disclosure.
Figure 3B:
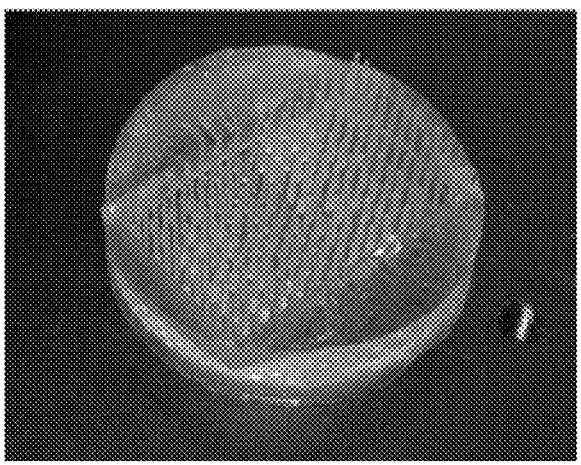
FIG. 3B is an image showing the resulting cast of the PCB shown in FIG. 3A.

Experiments were conducted to cast circuit features in accordance with embodiments of the present invention. For example, FIG. 2 is an image showing mounting cups that are each holding a coupon section submerged in molding material. FIG. 3A is an image showing an example PCB with vias that was submerged in molding material in accordance with embodiments of the present disclosure. FIG. 3B shows the resulting cast of the PCB shown in FIG. 3A.

Figure 4A:
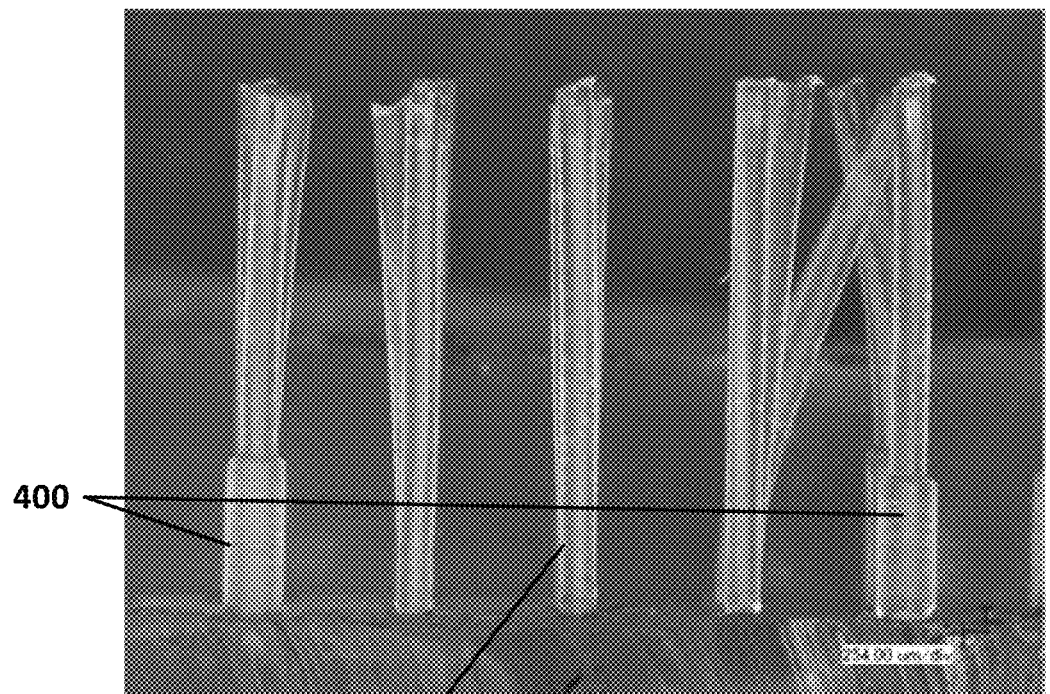
FIGS. 4A-4F are images of PTH casting results at 30×, 50×, 100×, and 200×magnification.
Figure 4B:
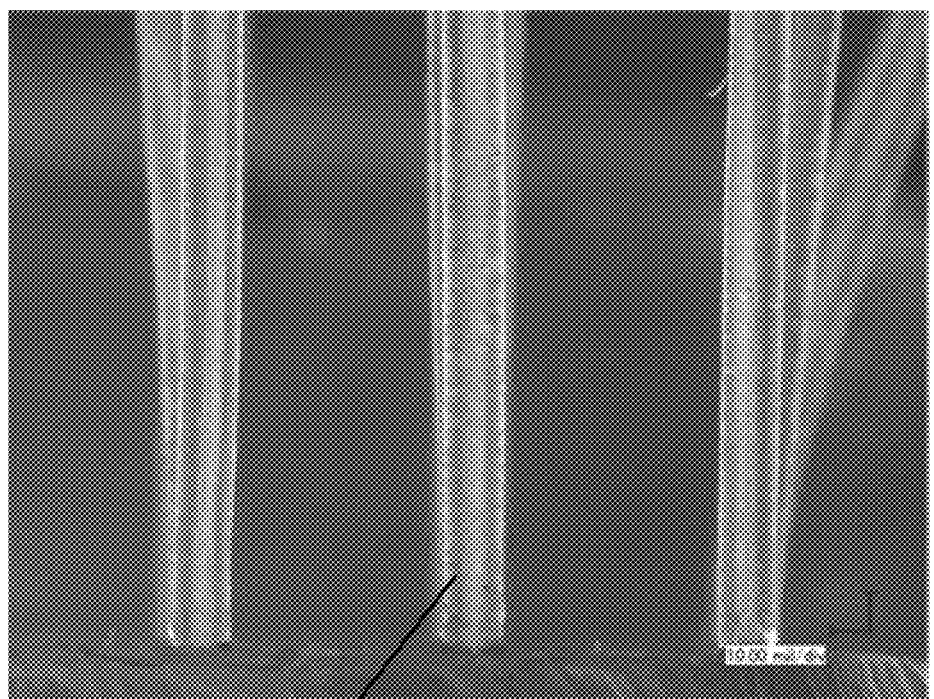
Figure 4C:
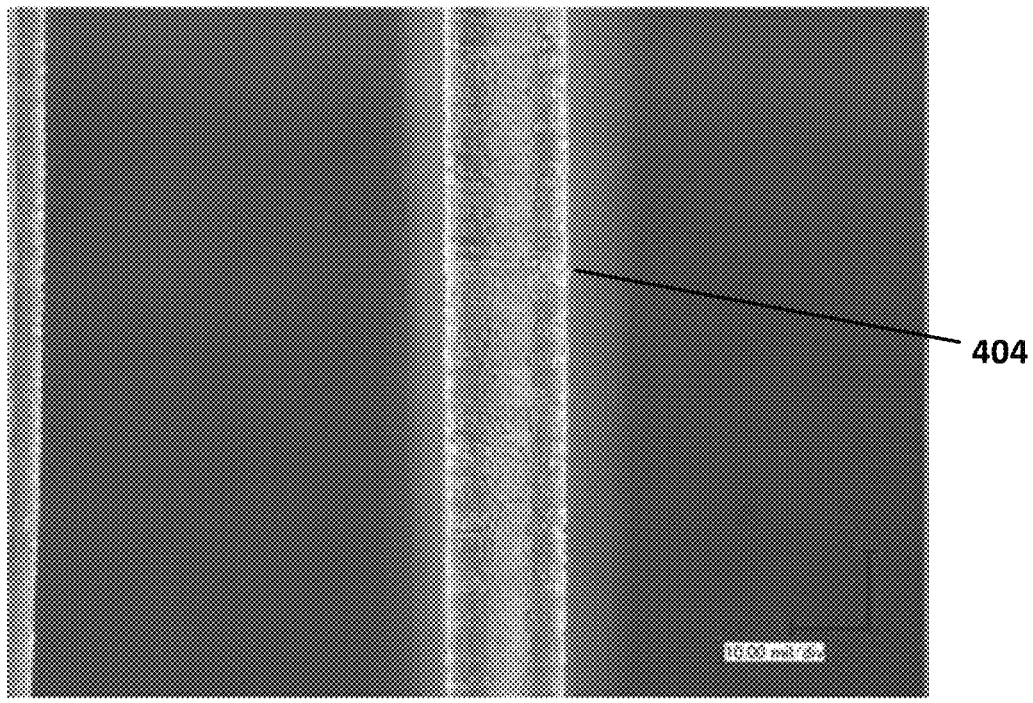
Figure 4D:
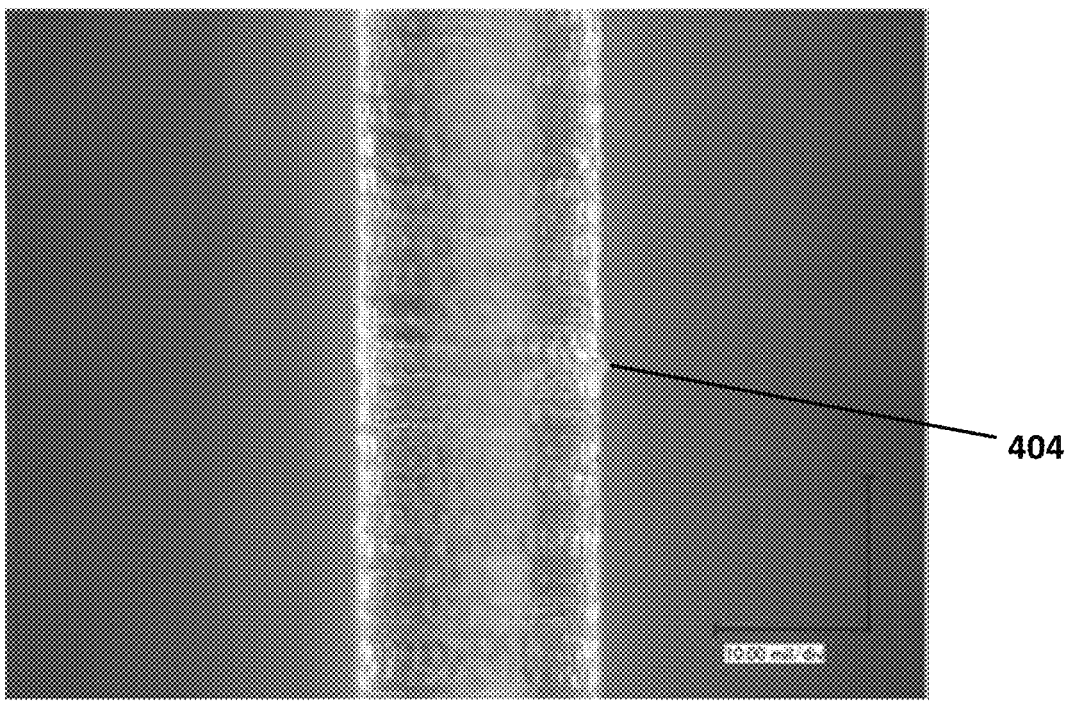
Figure 4E:
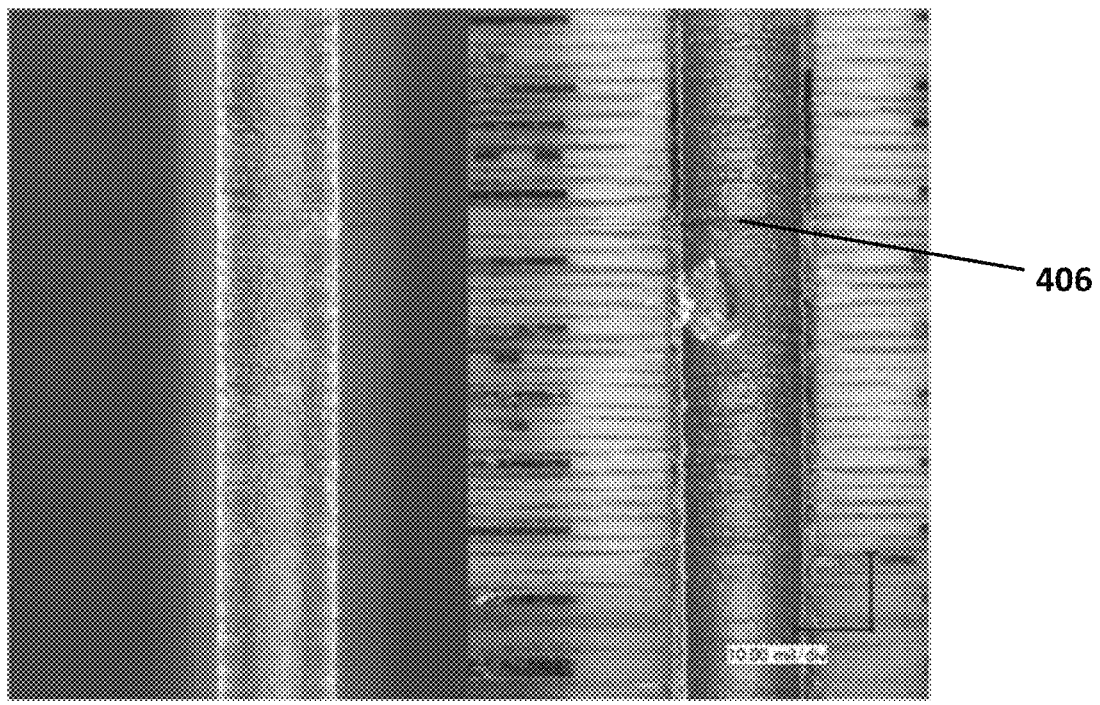
Figure 4F:
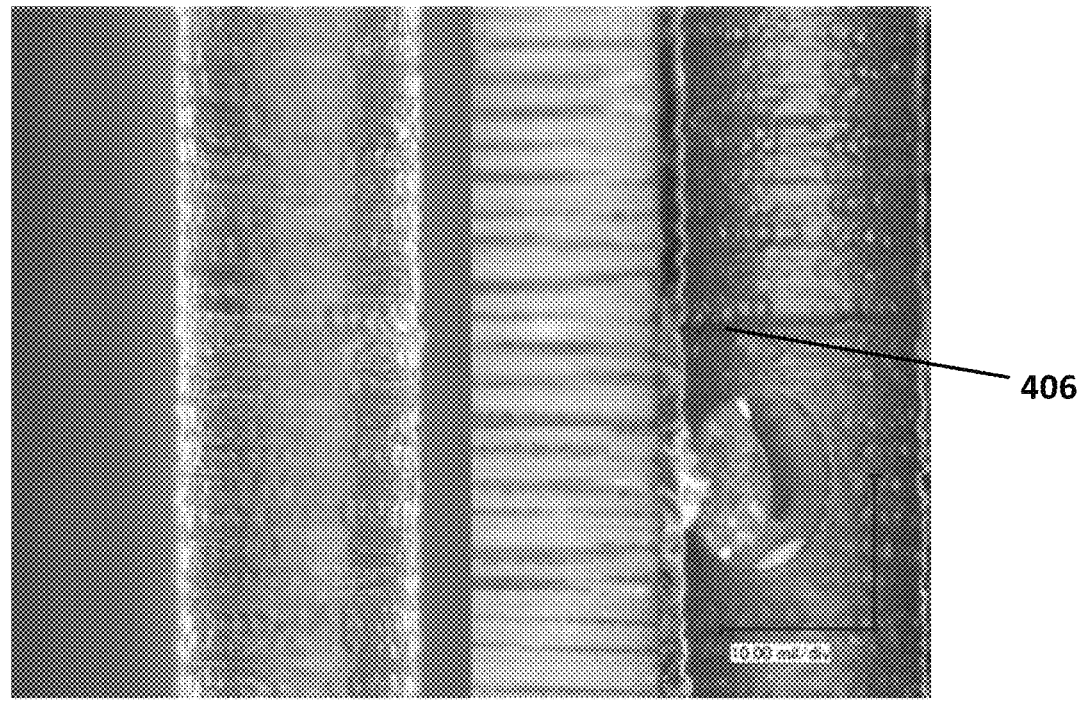

FIGS. 4A-4F are images of PTH casting results at 30× (FIG. 4A), 50×(FIG. 4B), 100×(FIGS. 4C and 4E), and 200×magnification (FIGS. 4D and 4F). The molding material in this example was SYLGARD® 184 silicone elastomer kit. Casting of a known defective PTH was conducted to demonstrate the ability to replicate barrel cracks. The figures show that cracks as well as other barrel topography, including backdrill can be replicated in the casting. The molding material in this example was SYLGARD® 184 silicone elastomer kit. A section of a printed circuit board with a known defect was submerged in the molding material in a mounting cup and placed under vacuum to pull the SYLGARD® 184 fully into the PTHs. After a sufficient amount of time (10-20 minutes), the molding material was cured at 100 degrees Celsius for approximately 1 hour. The hardened cast was then carefully removed from the molding cup and the printed circuit board section.

Referring to FIGS. 4A and 4B, reference number 400 refers to backdrill casting, and reference number 402 refers to a defective PTH cast. Reference number 404 in FIGS. 4C and 4D refers to a crack casting. Referring to FIGS. 4E and 4F, reference number 406 refers to a barrel crack.

Figure 5A:
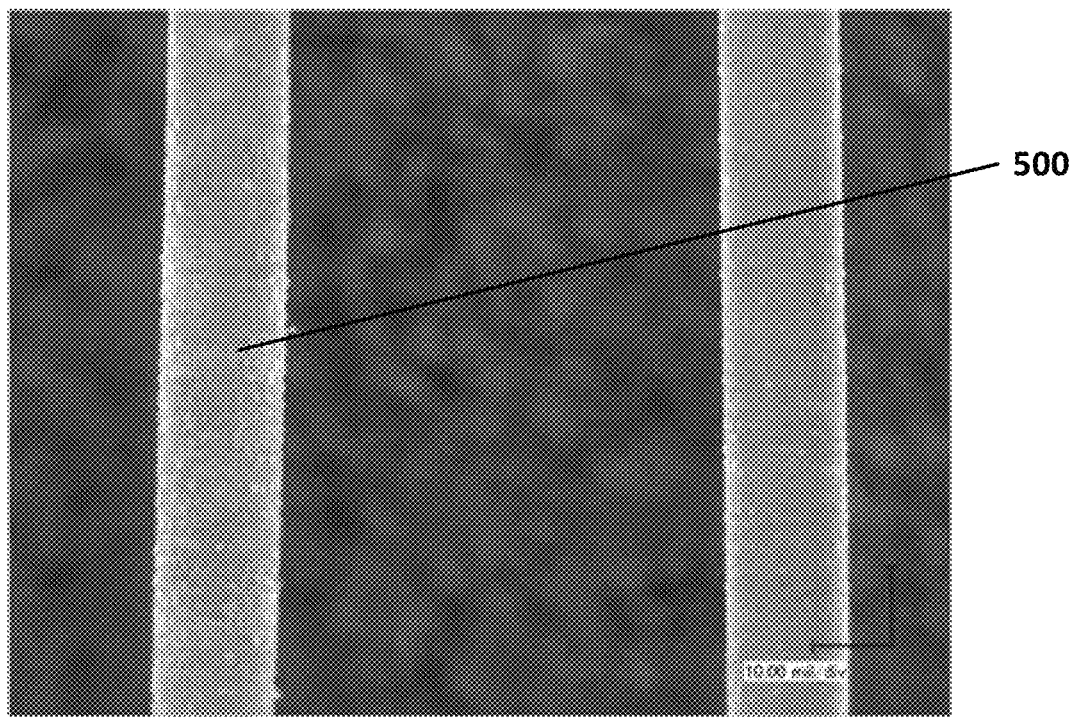
FIGS. 5A-5C are images of casting results on a PTH array known to have plating nodules.
Figure 5B:
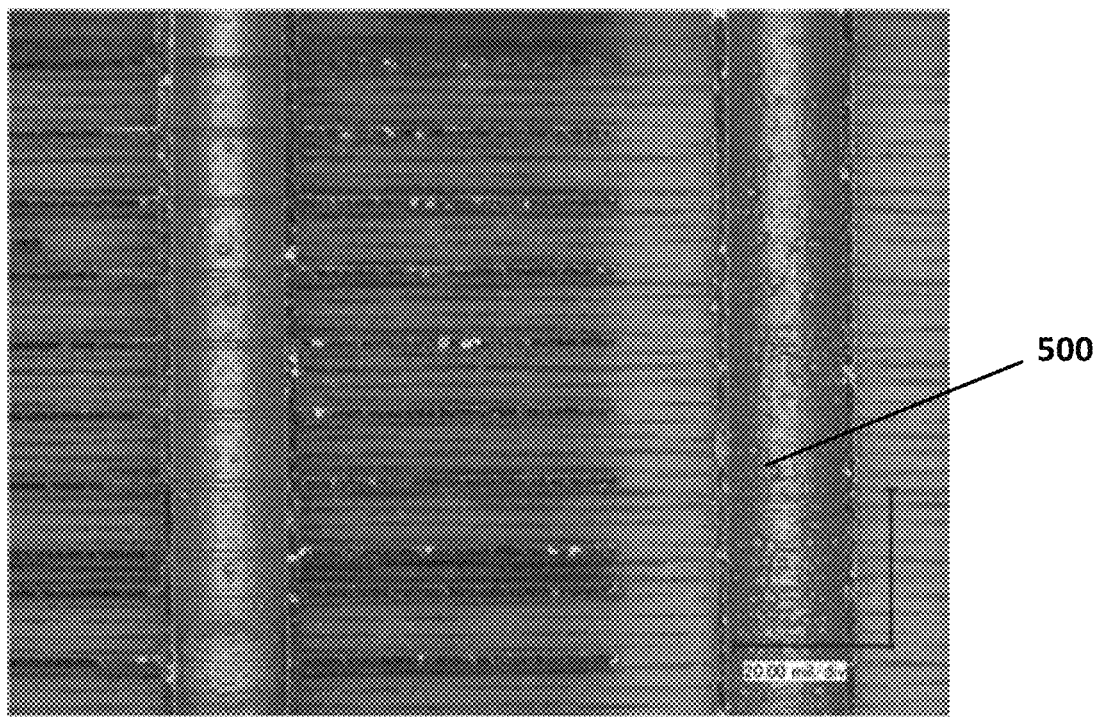
Figure 5C:
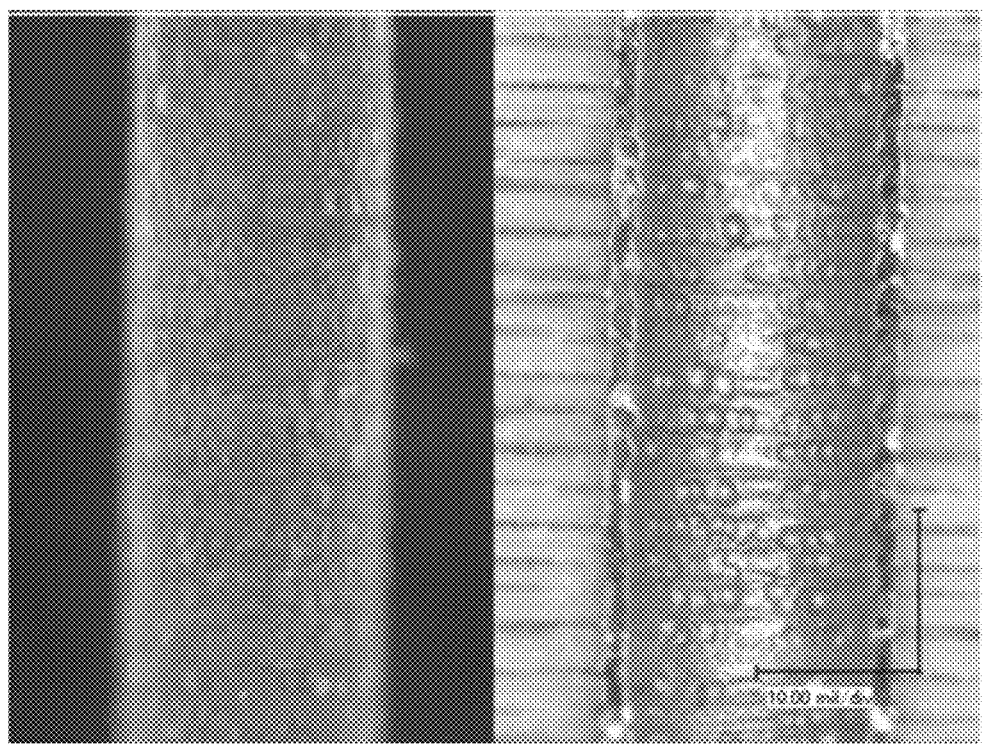

FIGS. 5A-5C are images of a different PTH cast showing replication of PTH plating nodules. The molding material in this example was SYLGARD® 184 silicone elastomer kit. Casting of a PTH array known to have plating nodules was conducted to demonstrate the ability to replicate surface irregularities. The molding material in this example was SYLGARD® 184 silicone elastomer kit. A section of a printed circuit board known to have plating nodules was submerged in the molding material in a mounting cup and placed under vacuum to pull the SYLGARD® 184 fully into the PTHs. After a sufficient amount of time (10-20 minutes), the molding material was cured at 100 degrees Celsius for approximately 1 hour. The hardened cast was then carefully removed from the molding cup and the printed circuit board section. Referring to FIGS. 5A and 5B, depressions from nodules 500 are visible.

The flowchart and block diagrams in the Figures illustrate the architecture, functionality, and operation of possible implementations of systems and methods according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   providing a container configured to hold a circuit board, having a top side and a bottom side, during a molding process;
   preparing a molding material comprising a pre-polymer base component and one of a hardener and curing agent component;
   applying the molding material inside a plated through-hole defining a pathway that extends between the top side and the bottom side of the circuit board to substantially cover sides of the plated through-hole with the molding material;
   curing the molding material; and
   separating the molding material from the plated through-hole, wherein the molding material, after being cured, reveals a cast of the plated through-hole of the circuit board.

2. The method of claim 1, wherein the ratio of pre-polymer base to hardener or curing agent is about 10:1.

3. The method of claim 1, wherein applying the molding material comprises using a pneumatic technique for inserting the molding material into the plated through-hole.

4. The method of claim 3, wherein using a pneumatic technique comprises:
   placing the circuit board into a vacuum chamber subsequent to application of the molding material to the plated through-hole; and
   using the vacuum chamber to move the molding material into the plated through-hole.

5. The method of claim 1, wherein curing the molding material comprises heating the molding material prior to separating the molding material from the plated through-hole.

6. The method of claim 1, wherein the plated through-hole is one of a plurality of plated through-holes of the circuit, wherein the method further comprises:
   applying the molding material inside each of the plated through-holes of the circuit board to substantially cover sides of each of the plated through-holes with the molding material;
   separating the cured molding material from each of the plated through-holes to reveal a cast of each of the plated through-holes;
   inspecting the cast of the plated through-holes to identify any defects; and
   providing recommendations to change the printed circuit board manufacturing process settings based on any observed defects.

7. The method of claim 1, wherein applying a molding material comprises placing the circuit board in the molding material held by the container.

8. A system for casting features comprising:
   a circuit board having a top side and a bottom side;
   a plated through hole defining a pathway that extends between the top side and the bottom side;
   at least one trace protruding from a side of the plated through hole;

a container configured to hold the circuit board during a molding process; and a molding material applicable to the plated through hole of the circuit board in the container, the molding material comprising a pre-polymer base component and one of a hardener and curing agent component, wherein the molding material is removable from the plated through hole following a curing of the molding material.

9. The system of claim 8 further comprising:

a vacuum pump configured to pull the molding material into the plated through hole.

10. The system of claim 8 wherein the molding material is disposed within the container.

\* \* \* \* \*